United States Patent
Brito et al.

(10) Patent No.: US 11,088,047 B2
(45) Date of Patent: Aug. 10, 2021

(54) CERAMIC PACKAGE OPENING, HEAT SINK, VIAS COUPLED TO CONDUCTIVE PAD

(71) Applicant: Texas Instruments Incorporated, Dallas, TX (US)

(72) Inventors: Joao Carlos Felicio Brito, Murphy, TX (US); Javier Antonio Valle Mayorga, Frisco, TX (US); Hector Torres, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/267,907

(22) Filed: Feb. 5, 2019

(65) Prior Publication Data

US 2020/0043825 A1 Feb. 6, 2020

Related U.S. Application Data

(60) Provisional application No. 62/714,368, filed on Aug. 3, 2018, provisional application No. 62/785,811, filed on Dec. 28, 2018.

(51) Int. Cl.
*H01L 23/367* (2006.01)
*H01L 23/498* (2006.01)
*H01L 23/00* (2006.01)
*H01L 21/48* (2006.01)

(52) U.S. Cl.
CPC ........ *H01L 23/3675* (2013.01); *H01L 21/486* (2013.01); *H01L 21/4853* (2013.01); *H01L 23/49811* (2013.01); *H01L 23/49827* (2013.01); *H01L 23/49833* (2013.01); *H01L 24/48* (2013.01); *H01L 24/85* (2013.01); *H01L 2224/48091* (2013.01); *H01L 2224/48157* (2013.01)

(58) Field of Classification Search
CPC .......... H01L 23/49827; H01L 23/3675; H01L 21/486; H01L 23/15; H01L 21/4853; H01L 23/49811; H01L 2224/48157
See application file for complete search history.

(56) References Cited

U.S. PATENT DOCUMENTS 5,608,261 A * 3/1997 Bhattacharyya ........ H01L 23/13
257/700
2018/0277395 A1* 9/2018 Masukawa .............. H01L 23/12

* cited by examiner

*Primary Examiner* — Quoc D Hoang
(74) *Attorney, Agent, or Firm* — Lawrence J. Bassuk; Charles A. Brill; Frank D. Cimino

(57) ABSTRACT

A hermetic ceramic package for high current signals includes a substrate made of a plurality of ceramic green sheets that form an upper body portion having an upper surface and a lower body portion having a lower surface and an intermediate surface between the upper surface and the lower surface. A first conductive plate is formed on the intermediate surface and a first plurality of conductive pad vias are formed in the lower body portion, extending from the first conductive plate to the lower surface of the lower body portion. A heat sink if coupled to the lower surface of the lower body portion and a first conductive pad also coupled to the lower surface such that the first conductive pad is electrically coupled to the first plurality of conductive pad vias.

24 Claims, 10 Drawing Sheets

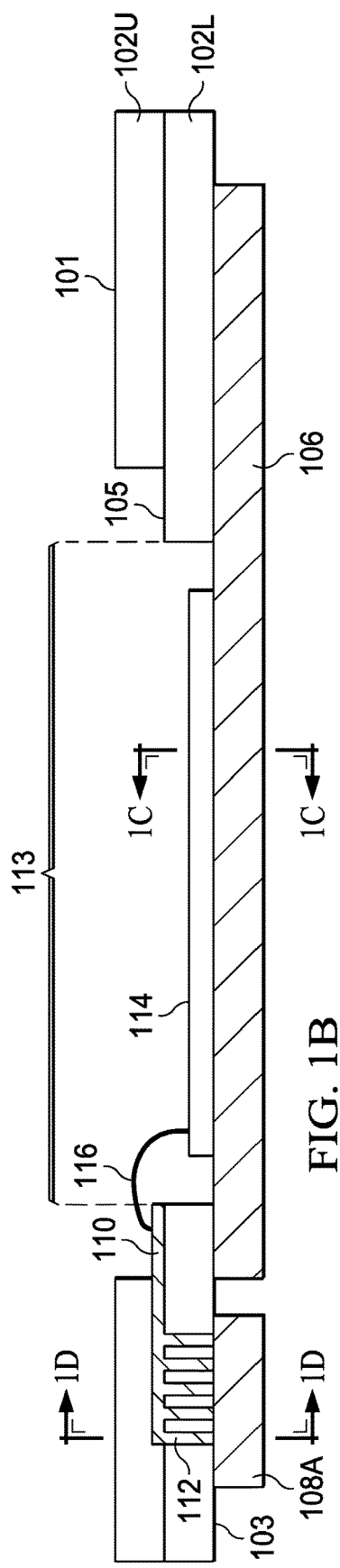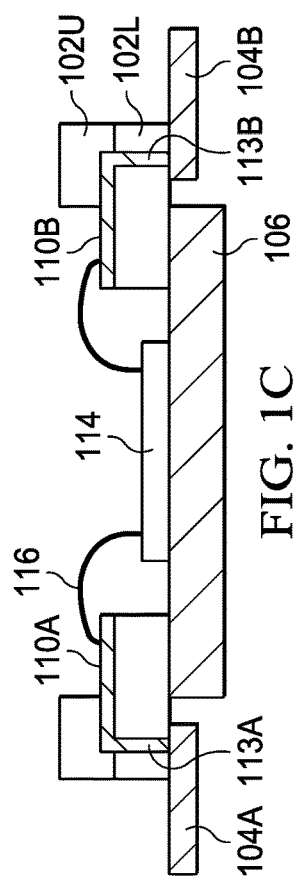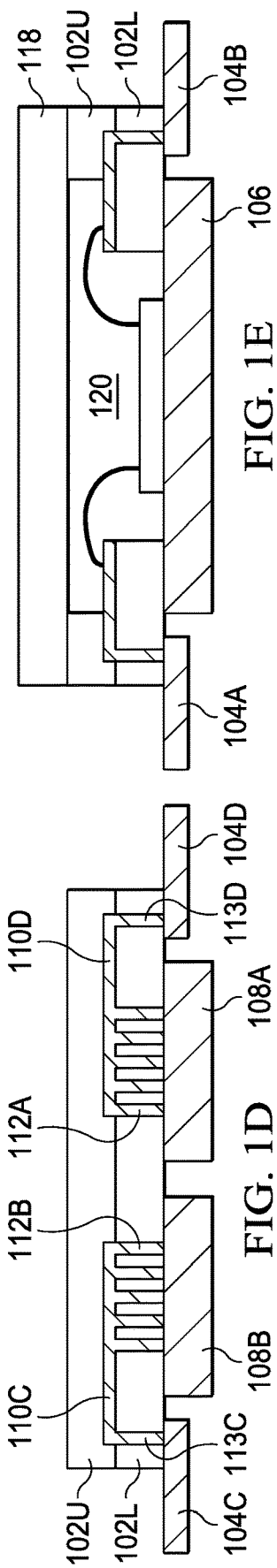
FIG. 1B
FIG. 1C
FIG. 1D
FIG. 1E

CERAMIC PACKAGE OPENING, HEAT SINK, VIAS COUPLED TO CONDUCTIVE PAD

PRIORITY UNDER 35 U.S.C. § 119(e) & 37 C.F.R. § 1.78

This non-provisional application claims priority based upon the following prior United States provisional patent application(s): (i) "Ceramic Package with Multiple Heat Sinks used as Pins for High Current Signals," Application No.: 62/714,368, filed Aug. 3, 2018, in the name(s) of Joao Carlos Brito, Javier Valle Mayorga, and Hector Torres, and (ii) "Ceramic Package for High Current Signals," Application No.: 62/785,811, filed Dec. 28, 2018, in the name(s) of Joao Carlos Felicio Brito, Javier Antonio Valle Mayorga, and Hector Torres, each of which is hereby incorporated by reference in its entirety.

FIELD OF THE DISCLOSURE

Disclosed embodiments relate generally to the field of packaging for electronic circuits. More particularly, and not by way of any limitation, the present disclosure is directed to a ceramic package for high current signals.

BACKGROUND

Ceramic packages are required by the Defense Logistics Agency for certain classes of integrated circuits. When high current signals are required in these ceramic packages, a conventional solution uses multiple pins coupled in parallel to reduce the resistance. This approach requires large packages with a high number of pins for high current signals in order to reduce the electrical resistance. Large packages require large printed circuit boards (PCBs), increasing the physical size of the system solution. While it is generally desirable to achieve smaller packages for most circuits, ceramic packages for outer space must be lifted out of earth's gravity well, further increasing the need to provide smaller, lighter packages.

SUMMARY

Disclosed embodiments provide a ceramic package having one or more conductive pads that are similar to a heat sink but that are utilized to carry current. In one embodiment, a major conductive pad is utilized as a heat sink for heat dissipation, while one or more generally smaller conductive pads are used as pins or connections for one or more high current signals. Conductive pads used as pins can provide a direct connection to the PCB and present lower electrical resistance compared to the package routing and lead resistance. This combination may also provide smaller packages.

In one aspect, an embodiment of a hermetic ceramic package for high current signals is disclosed. The ceramic package includes a substrate comprising ceramic green sheets that form an upper body portion having an upper surface and a lower body portion having a lower surface and an intermediate surface between the upper surface and the lower surface; a first conductive plate formed on the intermediate surface of the lower body portion; a first plurality or group of conductive pad vias formed in the lower body portion and extending from the first conductive plate to the lower surface of the lower body portion; a heat sink coupled to the lower surface of the lower body portion; and a first conductive pad coupled to the lower surface of the lower body portion such that the first conductive pad is electrically coupled to the first plurality or group of conductive pad vias.

In another aspect, an embodiment of a method of providing a hermetic ceramic package for high current signals is disclosed. The method includes forming a substrate comprising ceramic green sheets that form an upper body portion having an upper surface and a lower body portion having a lower surface and an intermediate surface that lies between the upper surface and the lower surface, a first conductive plate being provided on the intermediate surface, a first plurality or group of conductive pad vias extending from the first conductive plate to the lower surface and a first plurality or group of pin vias extending from the first conductive plate to the lower surface; attaching a heat sink to the lower surface of the lower body portion; attaching a first conductive pad to the lower surface of the lower body portion such that the first conductive pad is electrically coupled to the first plurality or group of conductive pad vias; and attaching a first plurality or group of pins to the substrate such that each of the first plurality or group of pins is electrically coupled to a respective one of the first plurality or group of pin vias.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 1B-1E depict different cross-sections of the ceramic package of FIG. 1A according to an embodiment of the disclosure;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The ceramic packages that are used for space and defense applications present a high electrical resistance due to material limitations. This is particularly a limitation for power applications that require low resistance to operate with high efficiency at large currents. As previously mentioned, a conventional solution for the high current signals uses multiple pins in parallel to reduce the resistance. This approach requires large packages with many pins in order to reduce the electrical resistance. Large packages require large PCBs increasing the physical size of the system solution.

Figure 6:
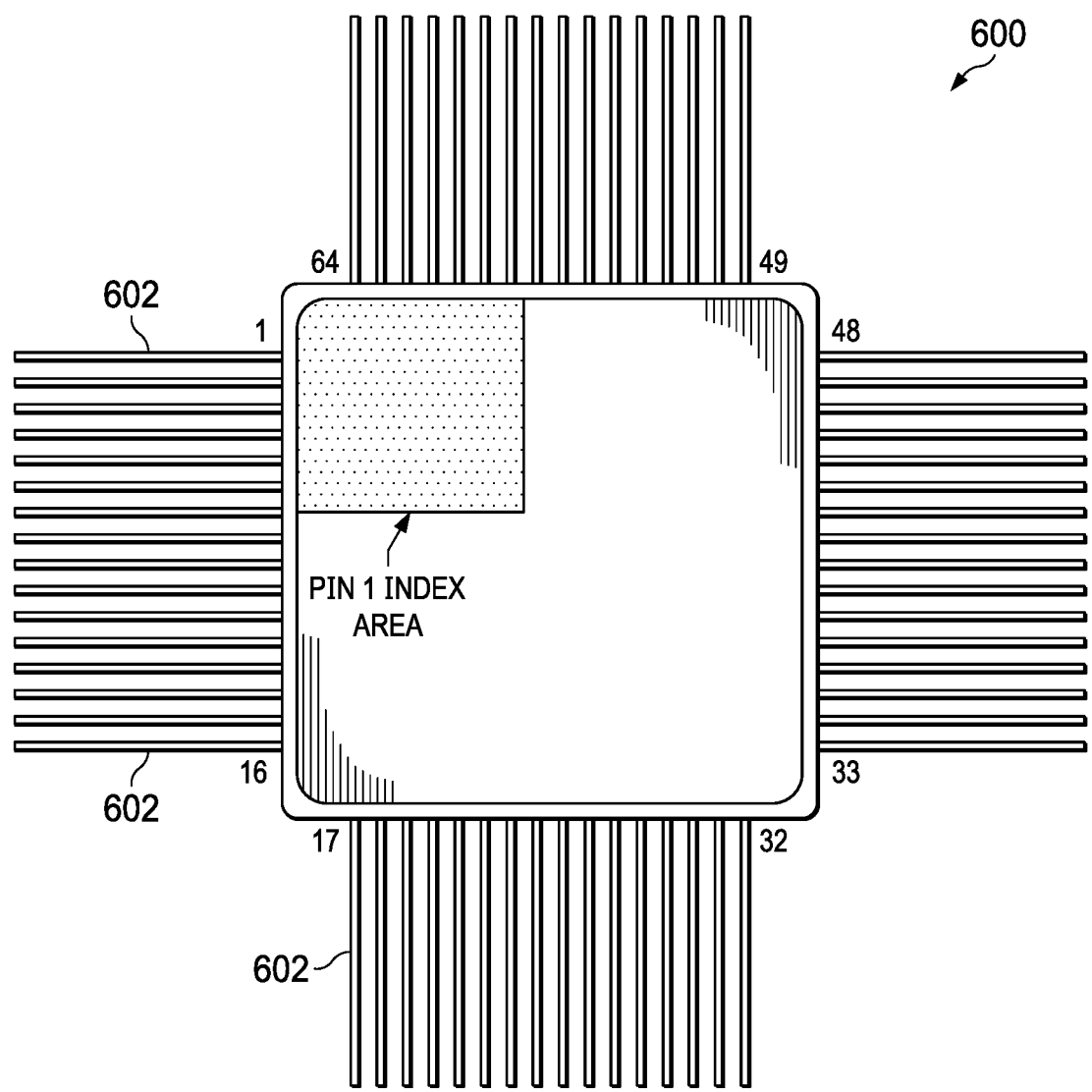
FIG. 6 depicts a ceramic package for a high current signals according to the prior art.

An example of a prior art ceramic package 600 for a power application is shown in FIG. 6, which depicts packaging for a buck regulator that provides 12 amps at 3.3 volts with ninety percent peak efficiency. The ceramic package is 14.4×14.4 mm$^2$, not including the pins, which means that this ceramic package delivers about 190 mW/mm$^2$. Additionally, ceramic package 600 requires sixty-four pins 602 to carry the desired signals at low resistance. The leads are longer on purpose when devices are shipped by the manufacturer so that the leads can be trimmed and formed to fit the customer specific PCB footprint.

Figure 1A:
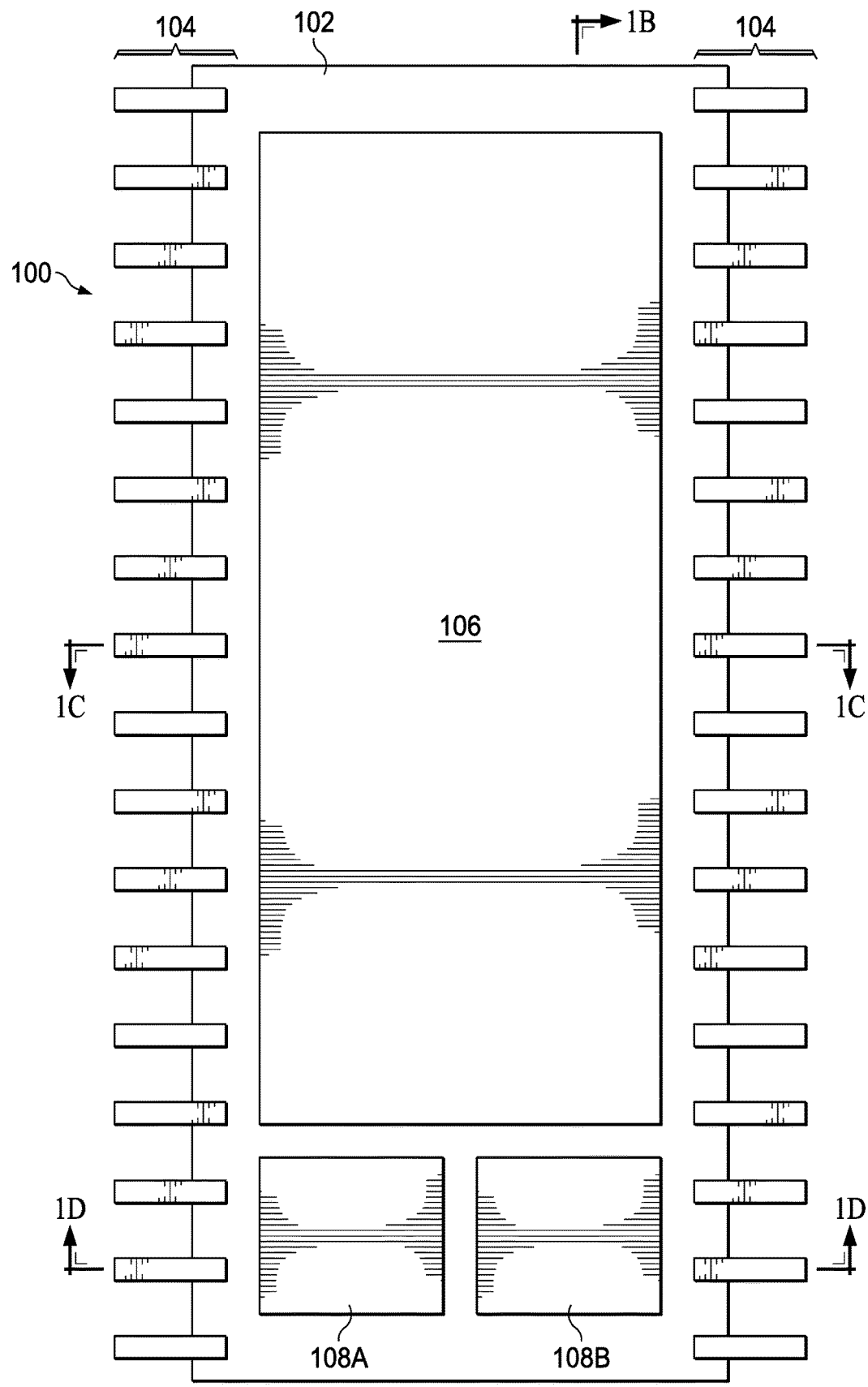
FIG. 1A depicts a view of the bottom of an example hermetic ceramic package for high current signals according to an embodiment of the disclosure.

FIG. 1A depicts a bottom view of a hermetic ceramic package 100 for high current signals according to an embodiment of the disclosure. Substrate 102 forms the body of ceramic package. In one embodiment, substrate 102 is formed of multiple ceramic green sheets, which are formed and utilized as follows. Ceramic and glass powders mixed with small quantities of a binding agent and solvent form a homogeneous slurry that is cast to form sheets of uniform thickness and dried, creating so-called ceramic green sheets. The ceramic green sheets are cut into shapes that include holes to form vias, which can be filled with a metal paste. These vias create vertical connections for the electrical feedthroughs, while planar electrical lines and conductive planes are defined on the ceramic sheets by screen printing which also uses metal pastes. Once the various metal structures are defined, the ceramic green sheets are stacked in a specific order and laminated to connect the individual sheets to create a three dimensional structure with hermetic electrical feedthroughs. The multilayer ceramic is co-fired at high temperatures to form a solid and hermetic ceramic.

In addition to substrate 102, hermetic ceramic package 100 also includes a number of conductive pins 104, and multiple conductive slugs or pads, some of which are utilized as pins or connections for high current signals. In the embodiment shown, a large conductive slug is used as heat sink 106 for thermal dissipation while two smaller conductive pads 108, are used as pins. Each of conductive pads 108 is designed to be directly attached to the PCB and to present low electrical resistance for an associated high-current signal.

Conductive pads 108 provide a much lower resistance than do pins 104 and may provide the ability to have a smaller package with fewer pins while still being able to drive a large current efficiently. In one embodiment, both heat sink 106 and conductive pads 108 are formed of copper tungsten (CuW), although other materials can also be utilized. In one embodiment, the disclosed ceramic package carries a buck regulator providing 18 amps and a peak efficiency of ninety percent at 3.3 volts. Through the use of the conductive pads 108, the size of hermetic ceramic package 100 (not including the leads) has been reduced to 7.37×20.3 mm$^2$, so that the package delivers about 400 mW/mm$^2$. The smaller package may provide a higher level of integration in situations where area becomes critical, particularly in space applications where power is typically designed as the last step. Size and weight are important features for space applications since these elements translate into high fuel costs to launch or fly the components. The locations of three different cross-sections through hermetic ceramic package 100 are shown in FIG. 1A and are marked by the figure number where each cross-section is shown.

FIG. 1B depicts a longitudinal cross-section through cross-section indicator 1B according to an embodiment of the disclosure. In FIG. 1B, substrate 102 can be seen to be composed of an upper body portion 102U and a lower body portion 102L that have different dimensions. Upper body portion 102U has an upper surface 101; lower body portion 102L includes a lower surface 103 and an intermediate surface 105 that lies between the upper surface 101 and the lower surface 103. Intermediate surface 105 is partially exposed and partially lies under upper body portion 102U. It can be seen in this figure that heat sink 106 and conductive pads 108 are directly attached to the lower surface 103 of lower body portion 102L, with heat sink 106 being positioned under an opening 113 that extends from the upper surface 101 of upper body portion 102U to the lower surface 103 of lower body portion 102L so that die 114 can be mounted directly to heat sink 106 to obtain efficient heat dissipation. Conductive pads 108 are mounted to lower body portion 102L such that multiple conductive pad vias 112 through lower body portion 102L are electrically coupled to each of conductive pads 108. Conductive pads 108 may be mounted to lower body portion 102L using, e.g., an electrically conductive adhesive such as a silicone or epoxy adhesive containing, e.g., silver, nickel and/or graphite. In one embodiment, AgCu braze material is fired to attach both conductive pads 108 and heat sink 106 to the substrate. A conductive plate 110 on intermediate surface 105 is electrically coupled to the multiple conductive pad vias 112 and also provides a region for bond wires 116 to be attached, so that the high-current signals will be conducted from IC chip 114 through the bond wires 116 to conductive plate 110, conductive pad vias 112, conductive pads 108 and eventually to a connection on the PCB (not specifically shown). It will be understood that while only one bond wire 116 is shown in this figure, in practice, many bond wires 116 may be used to couple IC chip 114 to a conductive plate 110 for a specific signal. The locations of the two cross-sections 1C and 1D through hermetic ceramic package 100 are also shown in FIG. 1B. FIG. 1C is a cross-section of hermetic ceramic package 100 taken at location 1C and FIG. 1D is a cross-section of hermetic ceramic package 100 taken at location 1D.

In the embodiment shown in this FIG. 1C, the cross-section passes through IC chip 114 at the position of two pins 104A, 104B that are coupled to IC chip 114. Conductive plate 110A is coupled to pin 104A through pin via 113A in lower body portion 102L and conductive plate 110B is coupled to pin 104B through pin via 113B in lower body portion 102L. Bond wires 116 couple each of conductive plates 110A, 110B to respective bond pads (not specifically shown) on IC chip 114.

FIG. 1D depicts a second cross-section of hermetic ceramic package 100 that goes through the conductive pads 108. Although IC chip 114 is not visible in this figure, conductive plates 110C, 110D can each be coupled to IC chip 114 using bond wires (not specifically shown). Conductive plate 110C is coupled to conductive pad 108A through multiple conductive pad vias 112A, of which five are shown in this figure. Conductive plate 110C is also coupled to pin 104C through pin via 113C. The number of conductive pad vias 112 utilized to carry current between conductive plate 110C and conductive pad 108A will generally be dictated by the overall design of the package and the amount of current the conductive pad is expected to carry, although it can be seen from FIGS. 1A and 1D that the multiple conductive pad vias are aligned both laterally and longitudinally within lower body portion 102L between respective pairs of conductive plate 110 and conductive pad 108. Similarly, conductive plate 110D is coupled to conductive pad 108B through multiple conductive pad vias 112B, of which five are again shown. Conductive plate 110D also couples to pin 104D through pin via 113D.

FIG. 1E repeats the cross-section of FIG. 1C with many of the reference numerals removed in order to illustrate a finished package that includes a lid 118. Lid 118 can be attached to the upper surface 101 of upper body portion 102U, e.g., using an adhesive, to provide a hermetically sealed cavity 120 that protect IC chip 114 from damage. In one embodiment, lid 118 is formed from the same ceramic green sheets utilized to form substrate 102. In the disclosed embodiment, lid 118 is shown as a flat slab that can be fastened to upper body portion 102U, e.g., by an adhesive. It will be understood that lid 118 may also have a different shape, e.g., a domed shape to provide greater room for bond wires 116 or a lip (not specifically shown) to provide a surface that positions and locks lid 118 into a desired position.

Figure 2:
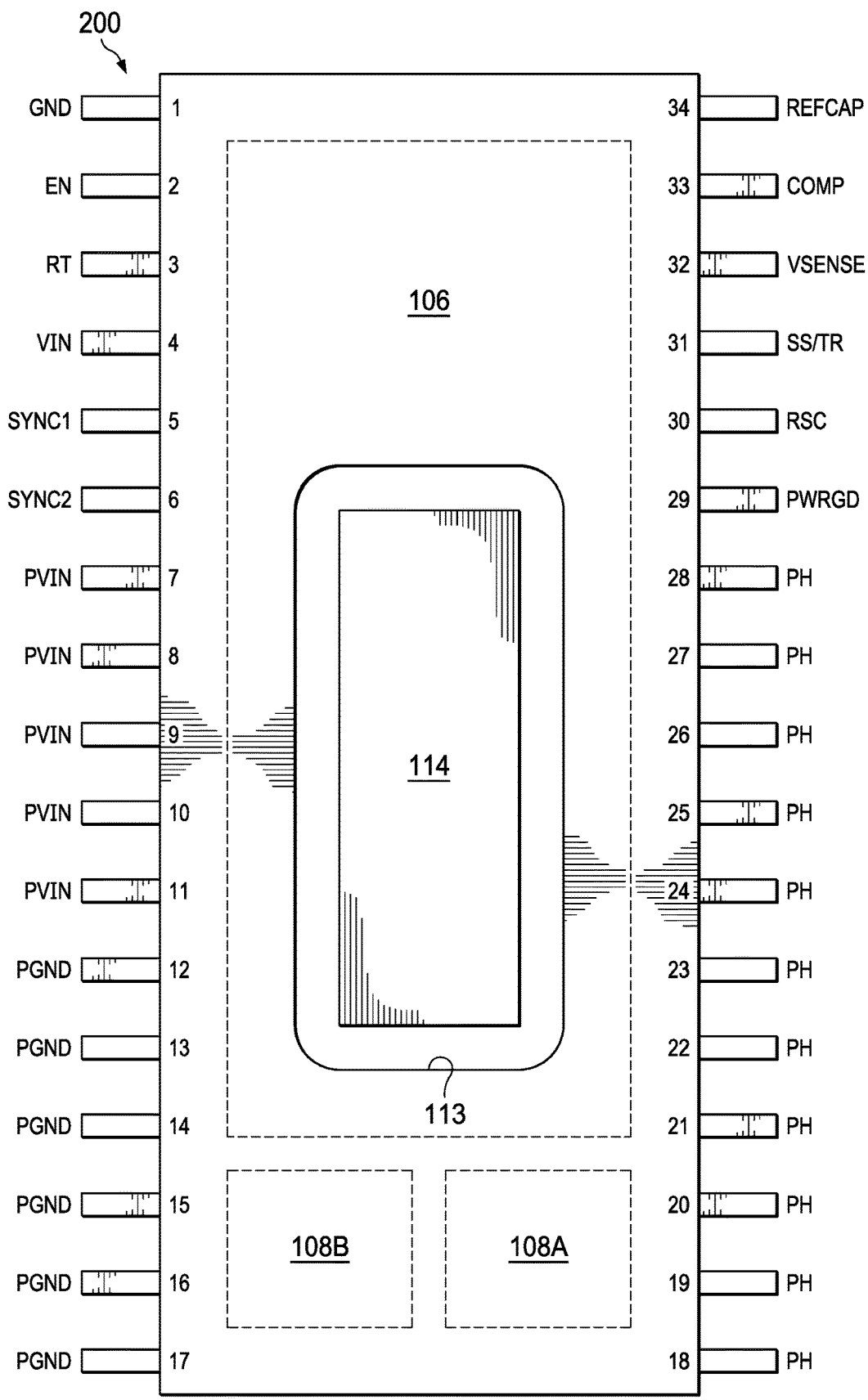
FIG. 2 depicts a high-level schematic pin layout of a ceramic package for high current signals according to an embodiment of the disclosure.

FIG. 2 depicts an outline of ceramic package 200, with the positions of heat sink 106 and conductive pads 108 shown as dotted lines and the position of IC chip 114 within opening 113 shown for reference. Also shown are the thirty-four pins for the signals utilized in this embodiment and the signals associated with each of the pins. Package 200 provides power in a space-related application and has three signals that carry high currents at least some of the time: power voltage-in signal PVIN, power ground signal PGND and switching signal PH. Of these three high current signals PVIN, PGND, PH, switching signal PH will carry an average current of about 18 A, power ground signal PGND will carry about seventy percent of that current and power voltage-in signal PVIN will carry about thirty percent. In the embodiment shown, power voltage-in signal PVIN has been allocated to five pins that are numbered 7-11; power ground PGND has been allocated both to the six pins numbered 12-17 and to conductive pad 108B; and switching signal PH has been allocated both to the eleven pins numbered 18-28 and to conductive pad 108A. Remaining signals are each assigned to one of the pins numbered 1-6 and 29-34.

Figure 3:
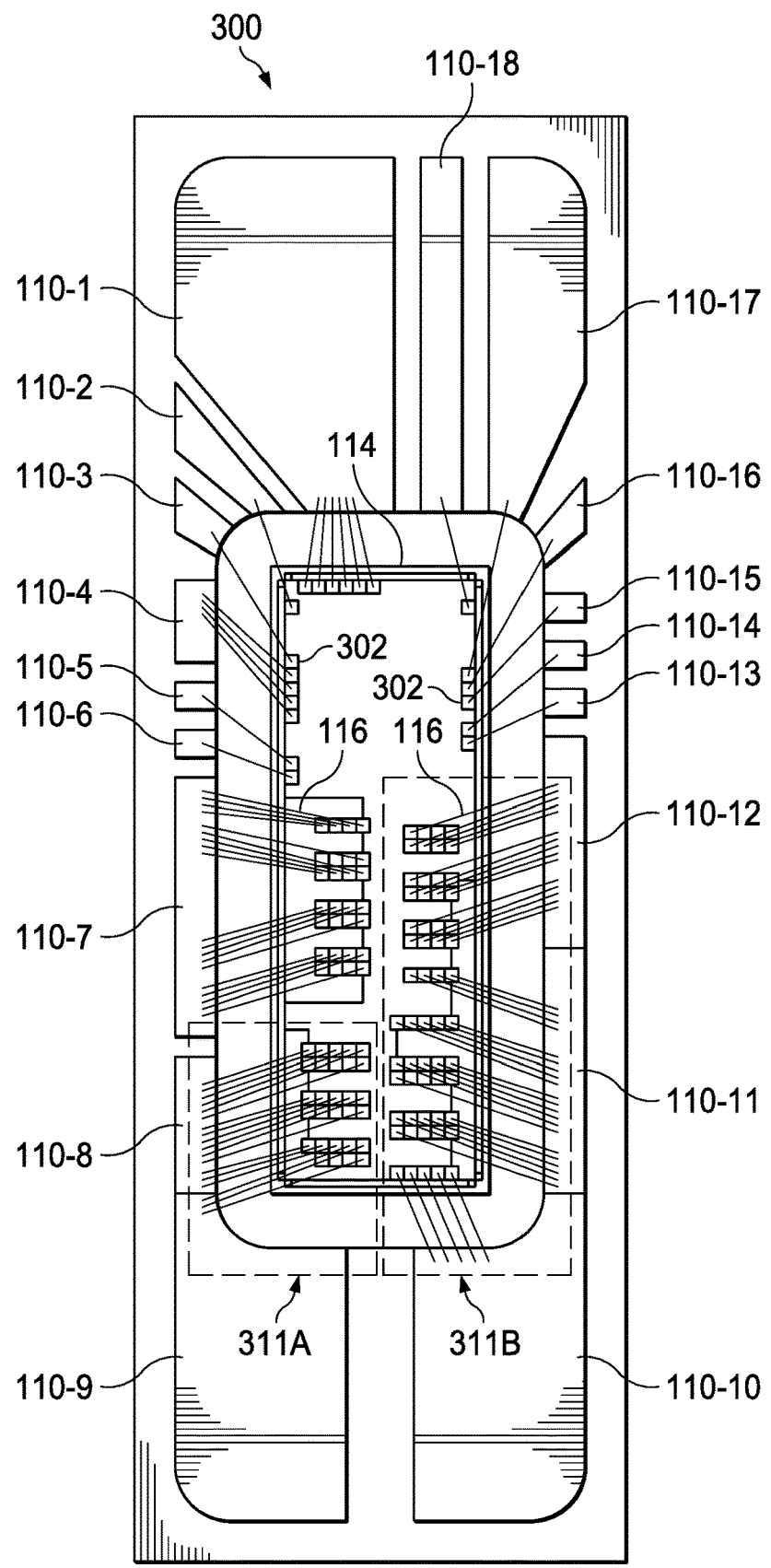
FIG. 3 depicts a MountBond diagram of the ceramic package of FIG. 2 according to an embodiment of the disclosure.

FIG. 3 depicts a MountBond diagram of a package 300 illustrating the level of the conductive plates 110 according to an embodiment of the disclosure. In the embodiment shown, there are eighteen conductive plates, which are numbered 110-1 through 110-18, and the bond wires 116 that couple IC chip 114 to conductive plates 110. It will be understood that the connections are provided as examples only and are not limiting of the disclosed embodiments. IC chip 114 contains a large number of bond pads 302 to which bond wires 116 can be soldered or otherwise attached. Conductive plate 110-1 corresponds to ground signal GND at pin 1, which provides a local ground for the logic level circuitry; six bond pads on IC chip 114 are coupled to conductive plate 110-1. Conductive plates 110-2, 110-3, 110-5 and 110-6, which correspond respectively to enable signal EN at pin 2, resistor timing signal RT at pin 3, first synchronization signal SYNC1 at pin 5 and second synchronization signal SYNC2 at pin 6, are each coupled by a single bond wire to a respective bond pad 302 on IC chip 114. Conductive plate 110-4, which corresponds to a logic-level voltage-in signal VIN, is coupled to IC chip 114 by four bond wires.

Conductive plate 110-7 corresponds to power voltage-in signal PVIN, which is shared among pins 7-11; conductive plate 110-7 is coupled to IC chip 114 by more than twenty bond wires. The power ground signal PGND is shared between conductive plate 110-8 and conductive plate 110-9. A first plurality of bond wires 311A, which number more than twenty, couples first conductive plate formed by conductive plates 110-8, 110-9 to IC chip 114; the first conductive plate couples the power ground signal PGND to a first plurality of pins 12-17 through a first plurality of pin vias (e.g. pin via 113C) and also coupled to a first conductive pad 108B through a first plurality of conductive pad vias 112B. Switching signal PH is also shared among multiple conductive plates. In the embodiment illustrated, a second conductive plate formed by conductive plates 110-10, 110-11, 110-12 is coupled to IC chip 114 by a second plurality of bond wires 311B that number more than fifty and is further coupled both to a second plurality of pins 18-28 through a second plurality of pin vias (e.g., pin via 113D) and also to second conductive pad 108A through a second plurality of conductive pad vias 112A.

The remaining signals include PWRGD, which is an open drain output that is asserted low if the output voltage is low for specific reasons and which is allocated to pin 29 and conductive plate 110-13, RSC, which is allocated to pin 30 and conductive plate 110-14, soft start/tracking signal SS/TR, which is allocated to pin 31 and conductive plate 110-15, voltage sense signal VSENSE, which is allocated to pin 32 and conductive plate 110-16, compensation signal COMP, which is allocated to pin 33 and conductive plate 110-17, and reference capacitance signal REFCAP, which is allocated to pin 34 and conductive plate 110-18. Each of the signals that are allocated to pins 29-34 are attached to IC chip 114 by a single bond wire.

Figure 4A:
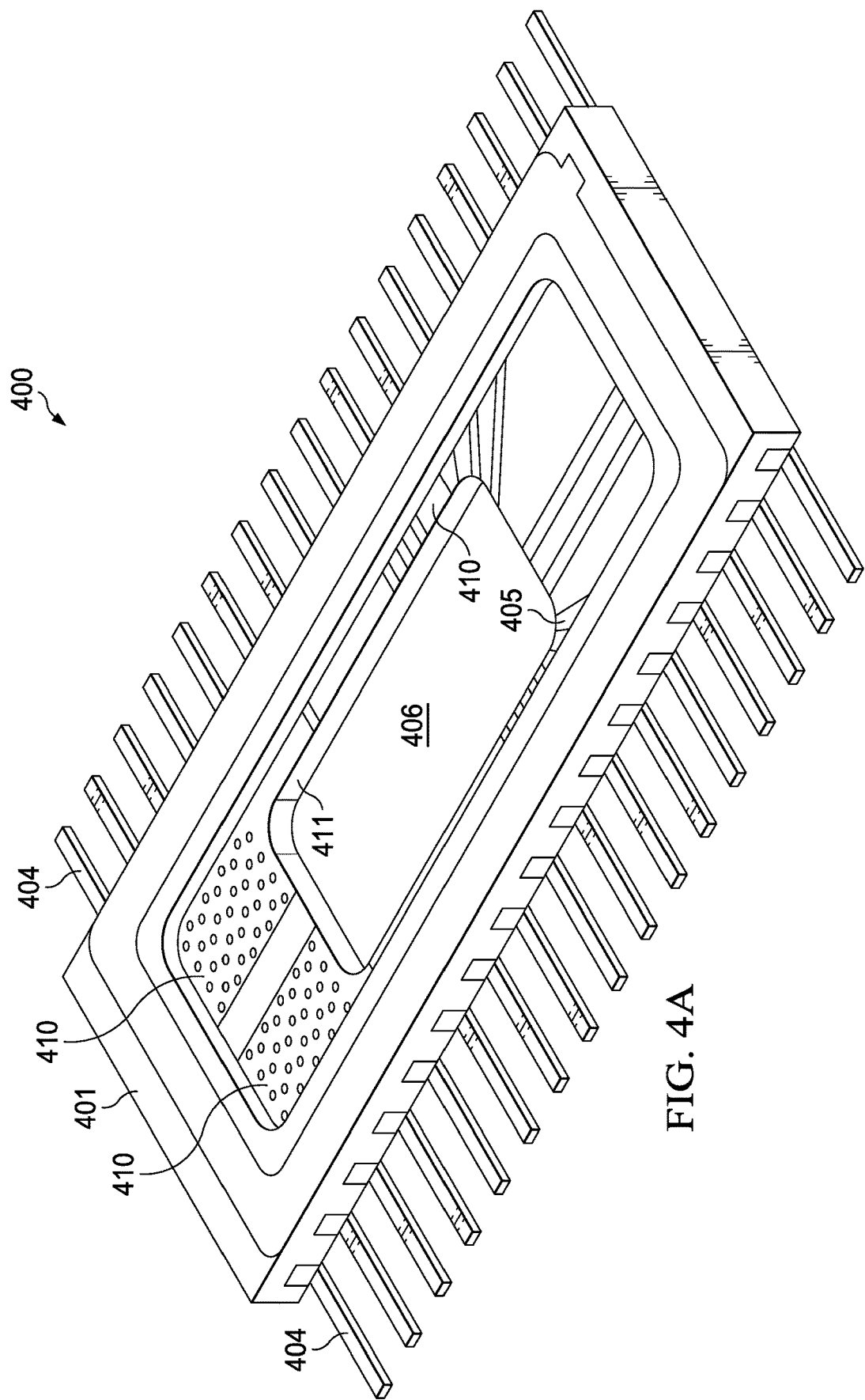
FIGS. 4A and 4B respectively depict a top perspective view and a bottom perspective view of a ceramic package according to an embodiment of the disclosure.
Figure 4B:
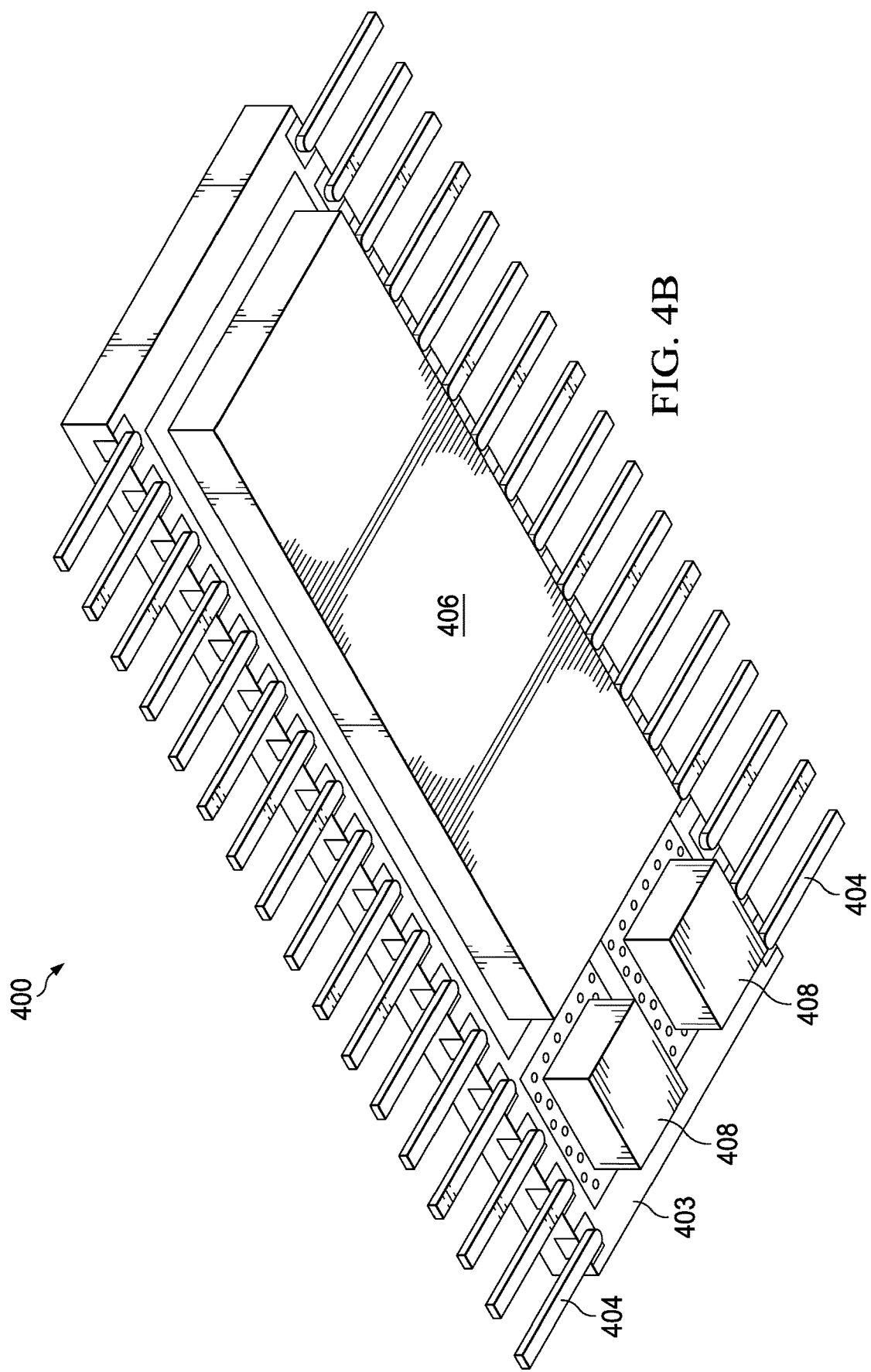
Figure 4C:
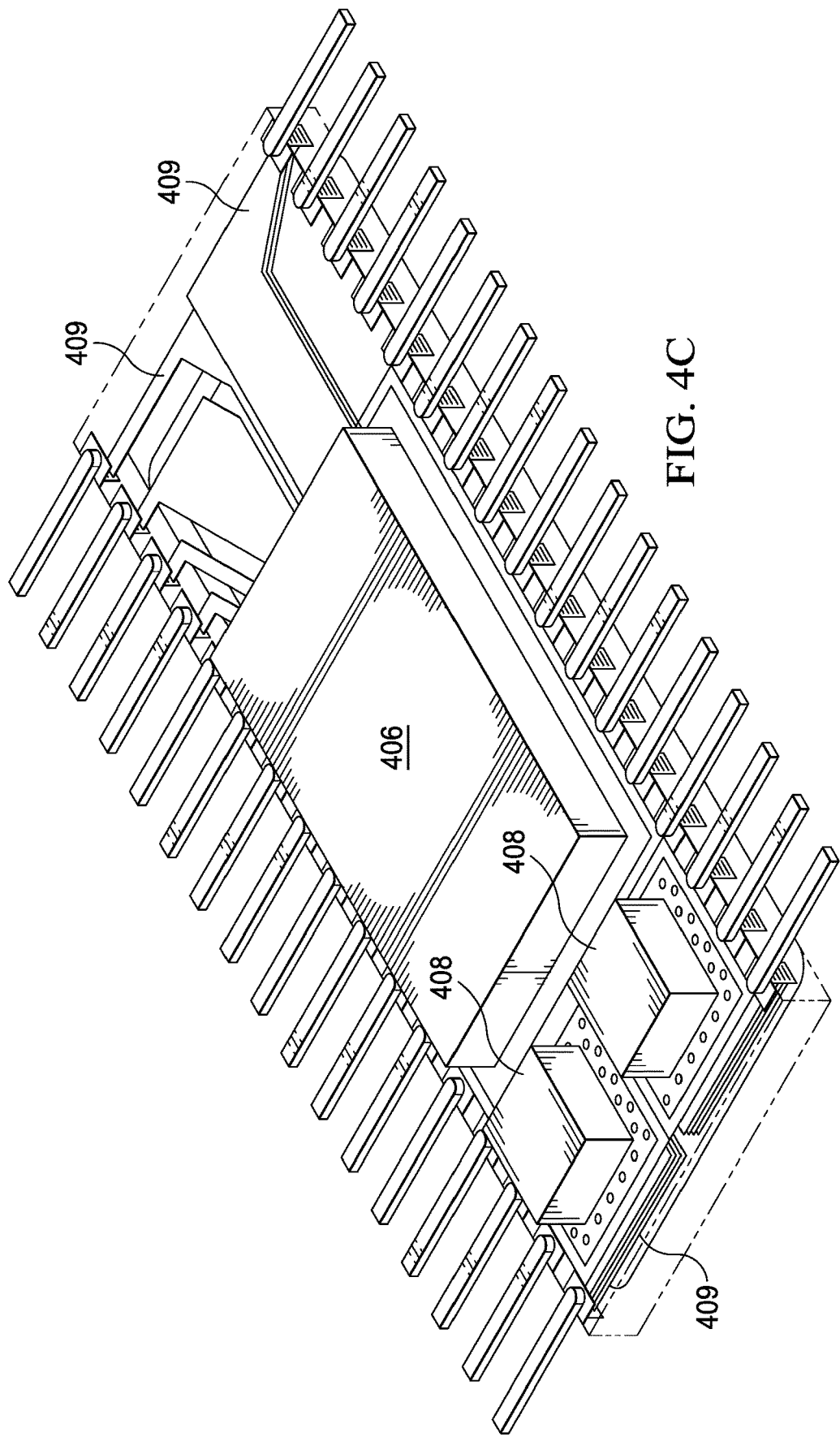
FIG. 4C depicts a bottom perspective of a ceramic package according to an embodiment of the disclosure.

FIGS. 4A and 4B offer a top perspective view and a bottom perspective view respectively of a ceramic package 400 according to an embodiment of the device and are depicted herein to better illustrate the three main levels of an embodiment of the disclosed ceramic package. The design in FIGS. 4A, 4B is generally similar to the embodiments shown in FIGS. 1A-1E, although several dimensions and the placement of several features is somewhat different. In the embodiment illustrated in the perspective views of ceramic package 400, upper surface 401 provides support for a lid that is added for the final product. Intermediate surface 405 is set below the level of upper surface 401 and provides a number of conductive plates 410 that along with the vias 112, 113 seen in FIGS. 1B-1D provide a path for the signals between the bond wires 304 seen in FIG. 3 and both pins 404 and conductive pads 408. Opening 411 extends from intermediate surface 405 to lower surface 403; a portion of mounted heat sink 406 can be seen through opening 411. Looking at the bottom view of ceramic package 400, heat sink 406 and conductive pads 408 are mounted to the lower surface 403 of ceramic package 400. FIG. 4C depicts a bottom perspective view of a ceramic package 400', which is an embodiment having a smaller overall heat sink 406. This figure is provided primarily to illustrate visible portions of the ceramic green sheets 409 that are used to form upper body portion 102U and lower body portion 102L as seen in FIGS. 1A-1D.

Figure 5:
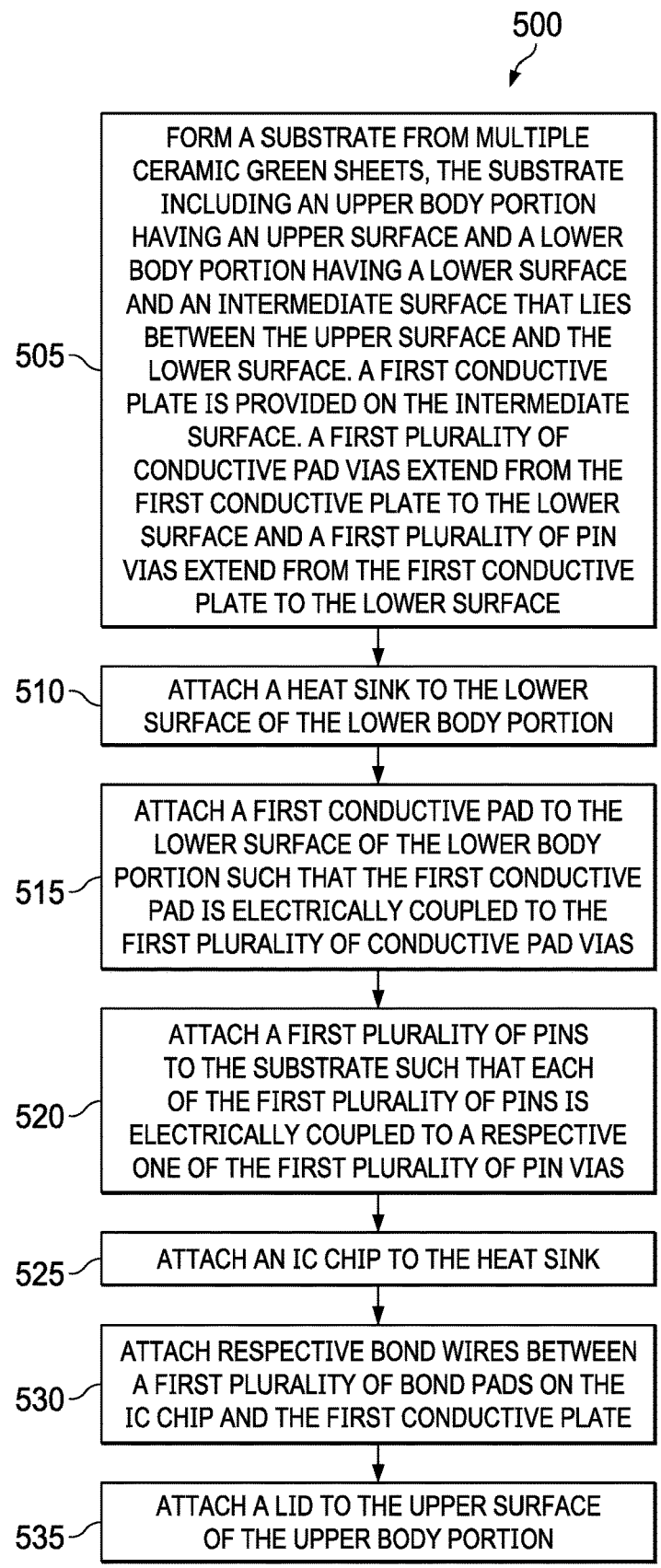
FIG. 5 is a flowchart of a method of providing a ceramic package for high current signals.

FIG. 5 depicts a method 500 of providing a hermetic ceramic package for high current signals according to an embodiment of the disclosure. Method 500 begins with forming (505) a substrate from multiple ceramic green sheets, where the substrate includes an upper body portion having an upper surface and a lower body portion having a lower surface and an intermediate surface that lies between the upper surface and the lower surface. A first conductive plate is provided on the intermediate surface. A first plurality of conductive pad vias extend from the first conductive plate to the lower surface and a first plurality of pin vias extend from the first conductive plate to the lower surface. The method then continues with attaching (510) a heat sink to the lower surface of the lower body portion and attaching (515) a first conductive pad to the lower surface of the lower body portion such that the first conductive pad is electrically coupled to the first plurality of conductive pad vias. A first plurality of pins are attached (520) to the substrate such that each of the first plurality of pins is electrically coupled to a respective one of the first plurality of pin vias. An IC chip is attached (525) to the heat sink and respective bond wires are attached (530) between a first plurality of bond pads on the IC chip and the first conductive plate. The method concludes with attaching (535) a lid to the upper surface of the upper body portion.

Figure 5A:
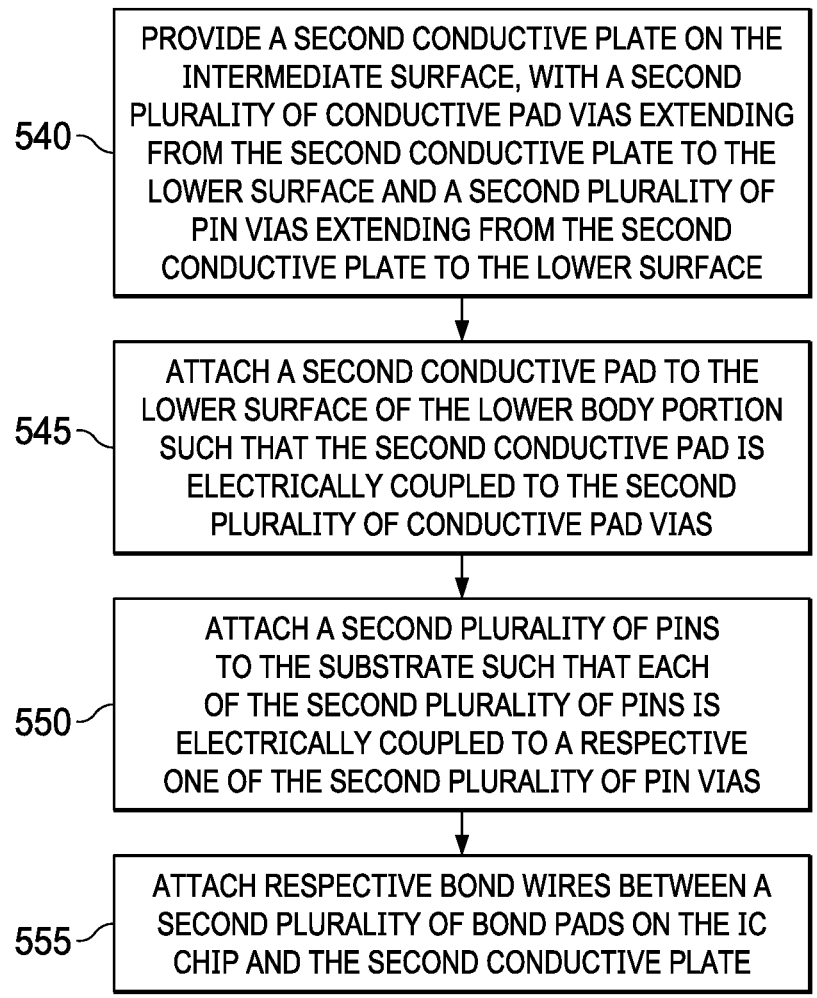
FIG. 5A depicts further elements of the method of FIG. 5.

FIG. 5A depicts additional elements that are performed when a second conductive pad is provided on the package. It will be understood that the elements of FIG. 5A are performed prior to the lid being attached to the substrate. In this instance, the method includes providing (540) a second conductive plate on the intermediate surface, with a second plurality of conductive pad vias extending from the second conductive plate to the lower surface and a second plurality of pin vias extending from the second conductive plate to the lower surface. A second conductive pad is attached (545) to the lower surface of the lower body portion such that the second conductive pad is electrically coupled to the second plurality of conductive pad vias and a second plurality of pins are attached (550) to the substrate such that each of the second plurality of pins is electrically coupled to a respective one of the second plurality of pin vias. Respective bond wires are attached (555) between a second plurality of bond pads on the IC chip and the second conductive plate.

Applicants have disclosed a hermetic ceramic package for high-current applications and a method of forming the hermetic ceramic package. By utilizing portions of heat sinks as pins, the number of pins necessary for the high-current signals can be reduced, providing a smaller ceramic package and a higher power density. The examples shown in this application use both conductive pads and regular pins to carry the signals having the highest current. In space and defense applications, due to the size of the hermetic ceramic packages and the thermal cycling that devices go through in outer space, it is desirable to have pins soldered to the printed circuit board for board-level reliability purposes. However, some embodiments can include only a conductive pad for a given signal if desired resistance levels and board-level reliability concerns can be met without the additional pins. Additional benefits from the use of conductive pads may include a higher level of integration into area-critical applications and lower costs when the ceramic package is launched into space.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A hermetic ceramic package for high current signals, the ceramic package comprising:
    a ceramic substrate including an upper body portion having an upper surface, a lower body portion having a lower surface, and having an intermediate surface between the upper surface and the lower surface, the substrate including an opening that extends from the upper surface of the upper body portion to the lower surface of the lower body portion;
    a first conductive plate formed on the intermediate surface;
    a first group of conductive pad vias formed in the lower body portion and extending from the first conductive plate to the lower surface of the lower body portion;
    a heat sink coupled to the lower surface of the lower body portion and positioned under the opening;
    a first conductive pad coupled to the lower surface of the lower body portion such that the first conductive pad is electrically coupled to the first group of conductive pad vias;
    a first pin attached to the substrate; and
    a first pin via formed in the lower body portion and extending from the first conductive plate to the first pin.

2. The ceramic package as recited in claim 1 including:
    a first group of pins attached to the substrate; and
    a first group of pin vias formed in the lower body portion, each of the first group of pin vias being coupled between a respective one of the first group of pins and the first conductive plate.

3. The ceramic package as recited in claim 2 including:
    a second conductive plate formed on the intermediate surface of the lower body portion;
    a second group of conductive pad vias formed in the lower body portion and extending from the second conductive plate to the lower surface of the lower body portion; and a second conductive pad coupled to the lower surface of the lower body portion such that the second conductive pad is electrically coupled to the second group of conductive pad vias.

4. The ceramic package as recited in claim 3 including:
a second group of pins attached to the substrate; and
a second group of pin vias formed in the lower body portion, each of the second group of pin vias being coupled between a respective one of the second group of pins and the second conductive plate.

5. The ceramic package as recited in claim 4 including an integrated circuit (IC) chip mounted to the heat sink within the opening.

6. The ceramic package as recited in claim 5 including:
a first group of bond wires coupled between a first group of bond pads on the IC chip and the first conductive plate; and
a second group of bond wires coupled between a second group of bond pads on the IC chip and the second conductive plate.

7. The ceramic package as recited in claim 6 including a lid fastened to the upper surface of the upper body portion.

8. A method of providing a hermetic ceramic package for high current signals, the method comprising:
forming a ceramic substrate including an upper body portion having an upper surface and a lower body portion having a lower surface and an intermediate surface that lies between the upper surface and the lower surface, a first conductive plate being provided on the intermediate surface, a first group of conductive pad vias extending from the first conductive plate to the lower surface and a first group of pin vias extending from the first conductive plate to the lower surface;
attaching a heat sink to the lower surface of the lower body portion;
attaching a first conductive pad to the lower surface of the lower body portion such that the first conductive pad is electrically coupled to the first group of conductive pad vias; and
attaching a first group of pins to the substrate such that each of the first group of pins is electrically coupled to a respective one of the first group of pin vias.

9. The method as recited in claim 8 including providing a second conductive plate on the intermediate surface, a second group of conductive pad vias extending from the second conductive plate to the lower surface and a second group of pin vias extending from the second conductive plate to the lower surface.

10. The method as recited in claim 9 including:
attaching a second conductive pad to the lower surface of the lower body portion such that the second conductive pad is electrically coupled to the second group of conductive pad vias; and
attaching a second group of pins to the substrate such that each of the second group of pins is electrically coupled to a respective one of the second group of pin vias.

11. The method as recited in claim 10 including:
attaching an integrated circuit (IC) chip to the heat sink;
attaching respective bond wires between a first group of bond pads on the IC chip and the first conductive plate; and
attaching respective bond wires between a second group of bond pads on the IC chip and the second conductive plate.

12. The method as recited in claim 11 including attaching a lid to the upper surface of the substrate.

13. The method of claim 8 in which the forming includes:
providing ceramic green sheets to form the upper body portion and the lower body portion; and
firing the ceramic green sheets to form a solid and hermetic ceramic body.

14. A ceramic package comprising:
an upper body portion having an upper surface, a lower body portion having a lower surface, an intermediate surface between the upper surface and the lower surface, and an opening that extends from the upper surface of the upper body portion to the lower surface of the lower body portion;
a first conductive plate formed on the intermediate surface;
a first group of vias formed in the lower body portion, the first group of vias extending from the first conductive plate to the lower surface of the lower body portion and being electrically coupled to the first conductive plate;
a heat sink coupled to the lower surface of the lower body portion and positioned under the opening;
a first conductive pad coupled to the lower surface of the lower body portion and being electrically coupled to the first group of vias;
a second conductive plate formed on the intermediate surface separate from the first conductive plate;
a second group of vias formed in the lower body portion, the second group of vias extending from the second conductive plate to the lower surface of the lower body portion, and being electrically coupled to the second conductive plate; and
a pin coupled to the lower surface of the lower body portion and electrically coupled to the second group of vias.

15. The ceramic package of claim 14 in which the heat sink closes the opening at the lower surface and including:
an integrated circuit mounted on the heat sink in the opening;
bond wires connected between the integrated circuit and the first conductive plate; and
a lid on the upper surface closing the opening at the upper surface.

16. The ceramic package of claim 14 in which:
the opening has a lower portion in the lower body and an upper portion in the upper body, the upper portion being larger than the lower portion to expose an upper surface of the lower body;
the intermediate surface is on the upper surface of the lower body; and
a portion of the intermediate surface and a portion of the first conductive plate are exposed to the opening.

17. A ceramic package comprising:
(a) a lower body portion having an upper intermediate surface, having a lower surface, having opposed side walls that form a central opening that extends from the upper intermediate surface to the lower surface of the lower body portion, and having via openings that extend from the upper intermediate surface to the lower surface of the lower body portion;
(b) an upper body portion formed on a covered part of the upper intermediate surface that includes the via openings to leave exposed an exposed part of the upper intermediate surface between the upper body portion and the side walls;
(c) a heat sink attached to the lower surface of the lower body portion and closing a bottom of the central opening between the side walls;

(d) a first conductive plate formed on the exposed part of the intermediate surface and extending on the covered part, through a first via opening;
(e) a first pin attached to the lower surface of the lower body portion and electrically coupled to the first conductive plate at the first via opening;
(f) a second conductive plate formed on the exposed part of the intermediate surface and extending on the covered part and through second via openings separate from the first via opening; and
(g) a first conductive pad, separate from the heat sink, attached to the lower surface of the lower body portion and electrically coupled to the second conductive plate at the second via openings.

18. The ceramic package of claim 17 including a second pin attached to the lower surface of the lower body portion and electrically coupled to the second conductive plate at the second via openings.

19. The ceramic package of claim 17 including:
(a) an integrated circuit mounted on the heat sink in the central opening;
(b) a first bond wire connected between the integrated circuit and the first conductive plate;
(c) second bond wires connected between the integrated circuit and the second conductive plate;
(d) the upper body portion having an upper surface; and
(e) a lid on the upper surface closing the central opening.

20. The ceramic package of claim 17 including:
(a) a third conductive plate formed on the exposed part of the intermediate surface and extending on the covered part and through third via openings separate from the first and second via openings;
(g) a third pin attached to the lower surface of the lower body portion and electrically coupled to the third conductive plate at the third via openings; and
(h) a second conductive pad, separate from the heat sink and the first conductive pad, attached to the lower surface of the lower body portion and electrically coupled to the third conductive plate at the third via openings.

21. The ceramic package of claim 20 including:
(a) an integrated circuit mounted on the heat sink in the central opening;
(b) a first bond wire connected between the integrated circuit and the first conductive plate;
(c) second bond wires connected between the integrated circuit and the second conductive plate;
(d) third bond wires connected between the integrated circuit and the third conductive plate;
(d) the upper body portion having an upper surface; and
(e) a lid on the upper surface closing the central opening.

22. The ceramic package of claim 17 including AgCu braze material attaching the heat sink and first conductive pad to the lower surface of the lower body portion.

23. The ceramic package of claim 17 including:
a power integrated circuit mounted on the heat sink in the central opening and having bond pads, and
bond wires coupling the bond pads to the conductive plates.

24. The ceramic package of claim 23 including:
(a) eighteen conductive plates formed on the exposed part of the intermediate surface and extending on the covered part through via openings; and
(b) 34 pins coupled to the via openings, the 34 pins carrying:
a ground signal GND at pin 1;
an enable signal EN at pin 2;
a resistor timing signal RT at pin 3;
a logic-level voltage-in signal VIN at pin 4;
a first synchronization signal SYNC1 at pin 5;
a second synchronization signal SYNC2 at pin 6;
a power voltage-in signal PVIN is shared among pins 7-11;
a power ground signal PGND is shared among pins 12-17;
a switching signal PH is shared among pins 18-28;
an open drain output PWRGD at pin 29
an RSC signal at pin 30;
a soft start/tracking signal SS/TR at pin 31;
a voltage sense signal VSENSE at pin 32;
a compensation signal COMP at pin 33; and
a reference capacitance signal REFCAP at pin 34.

* * * * *